(12) United States Patent
Schneegans et al.

(10) Patent No.: US 7,755,190 B2
(45) Date of Patent: Jul. 13, 2010

(54) ELECTRONIC DEVICE INCLUDING A NICKEL-PALLADIUM ALLOY LAYER

(75) Inventors: Manfred Schneegans, Vaterstetten (DE); Holger Torwesten, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 11/835,123

(22) Filed: Aug. 7, 2007

(65) Prior Publication Data

US 2008/0081157 A1 Apr. 3, 2008

(30) Foreign Application Priority Data

Aug. 7, 2006 (DE) .................. 10 2006 036 798

(51) Int. Cl.
*B32B 3/00* (2006.01)
*C25D 3/56* (2006.01)
*H01B 1/02* (2006.01)

(52) U.S. Cl. .......... 257/734; 257/E23.02; 257/E23.052; 257/E25.013; 257/762; 257/766; 257/758; 257/773; 428/457; 428/336; 428/189; 205/257; 252/521.2

(58) Field of Classification Search ............ 257/E23.02, 257/E23.052, E25.013, 734, 762, 766, 758, 257/773; 428/457, 336, 189; 205/257; 252/521.2
See application file for complete search history.

(56) References Cited

U.S. PATENT DOCUMENTS

| | | | | |
|---|---|---|---|---|
| 5,998,337 | A * | 12/1999 | Hatta et al. ................. | 505/236 |
| 6,528,358 | B1 * | 3/2003 | Yamazaki et al. ........... | 438/151 |
| 6,762,122 | B2 | 7/2004 | Mis et al. | |
| 6,884,644 | B1 * | 4/2005 | Slater et al. .................. | 438/20 |
| 6,995,475 | B2 | 2/2006 | Biggs et al. | |
| 2001/0004133 | A1 | 6/2001 | Ihara | |
| 2002/0017553 | A1 | 2/2002 | Jao | |
| 2005/0012225 | A1 | 1/2005 | Choi et al. | |
| 2005/0073057 | A1 | 4/2005 | Tiziani et al. | |
| 2006/0239893 | A1 * | 10/2006 | Zhang et al. ............ | 423/445 R |
| 2008/0248648 | A1 * | 10/2008 | Thompson et al. ......... | 438/681 |

FOREIGN PATENT DOCUMENTS

JP 11-74438 * 3/1999

* cited by examiner

*Primary Examiner*—Alexander O Williams
(74) *Attorney, Agent, or Firm*—Dicke, Billig & Czaja, PLLC

(57) ABSTRACT

An electronic device and the production thereof is disclosed. One embodiment includes an integrated component having a layer containing a nickel-palladium alloy.

31 Claims, 3 Drawing Sheets

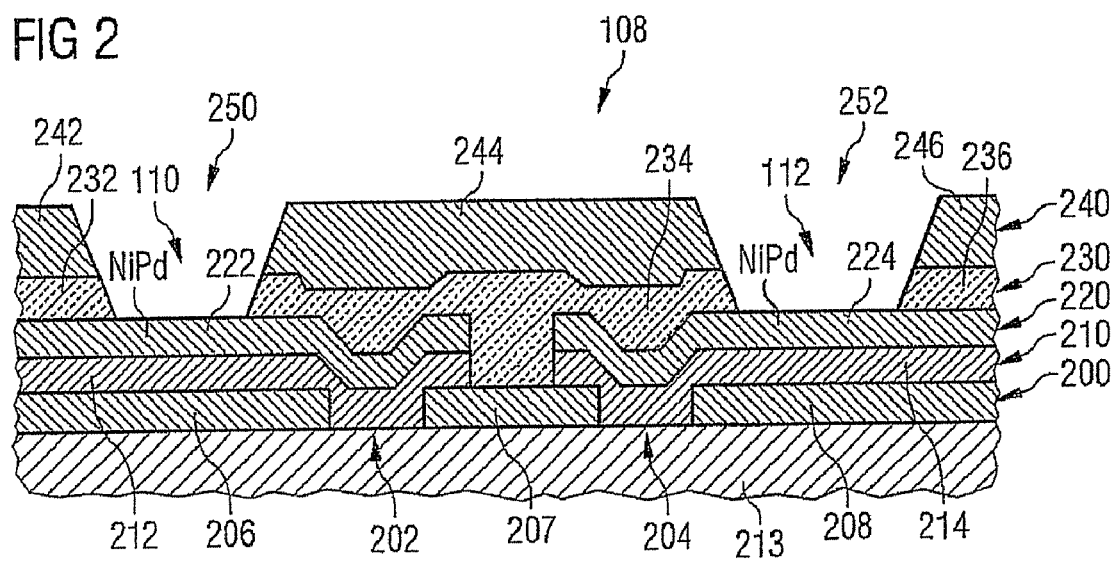
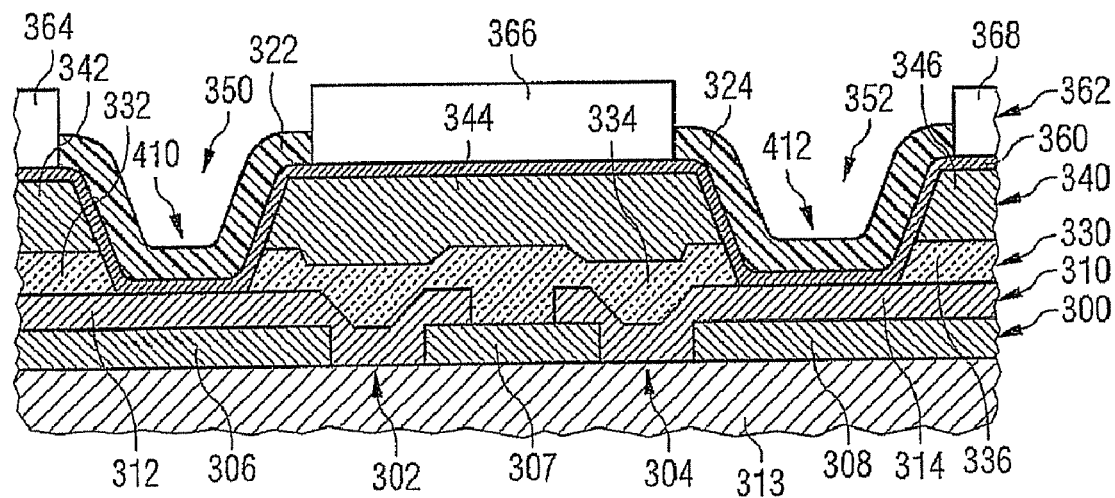

ELECTRONIC DEVICE INCLUDING A NICKEL-PALLADIUM ALLOY LAYER

CROSS-REFERENCE TO RELATED APPLICATIONS

This Utility Patent Application claims priority to German Patent Application No. DE 10 2006 036 798.7 filed on Aug. 7, 2006, which is incorporated herein by reference.

BACKGROUND

Integrated components with an integrated circuit can contain a multiplicity of semiconductor circuit elements, e.g., transistors, diodes, etc. There are also integrated components with only a single circuit element. The integrated components are used e.g., in motor vehicle electronic circuits, mobile radio devices, cameras, etc. A connection device is used to connect the integrated component e.g., to a printed circuit board or to a heat sink.

There is a need for a simply constructed device. In particular, the device is intended to have high performance and/or be simple to produce.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 illustrates a cross section through a connection device in accordance with a second exemplary embodiment, wherein the connection device contains aluminum.

FIG. 3 illustrates a cross section through a connection device in accordance with a third exemplary embodiment, wherein the connection device likewise contains aluminum.

DETAILED DESCRIPTION

Figure 1A:
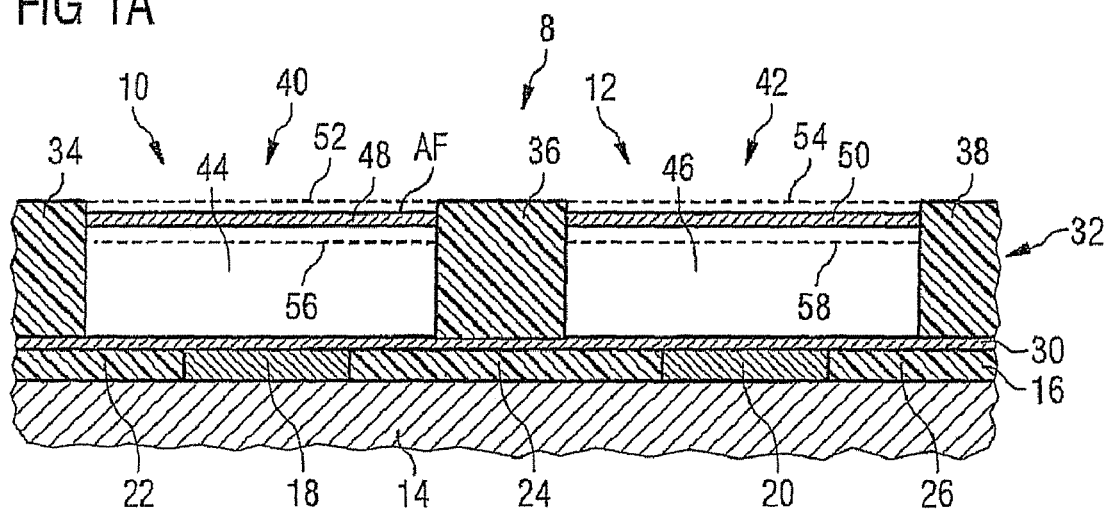
FIGS. 1A and 1B illustrate production stages in the production of a connection device in accordance with a first exemplary embodiment using copper.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides an electronic device including an integrated component having a layer containing a nickel-palladium alloy.

Furthermore, one embodiment provides a method for producing an electronic component. A first conductive material is applied on a substrate. A second conductive material, containing a nickel-palladium alloy, is applied on the first conductive material.

Another embodiment provides a method for producing an electronic device. A mask is applied to a substrate. A first conductive material is applied selectively with respect to the mask by a first electrochemical deposition process with external current. A second conductive material, which differs from the first material, is applied selectively with respect to the mask by a second electrochemical deposition process with external current.

In one embodiment, an electronic device is provided, including an integrated component having a layer or a protective layer containing a nickel-palladium alloy. The nickel-palladium alloy can contain further metallic or nonmetallic elements or be free of further additions. The layer having the nickel-palladium alloy has a layer thickness within the range of 0.5 micrometer to 3 micrometers or in one embodiment a layer thickness within the range of 1 micrometer to 3 micrometers. Consequently, the protective layer affords a sufficiently high mechanical resistance to cracks due to bonding or due to needles of needle card adapters.

The nickel-palladium alloy is used, or can be used, as a protective layer on an outer integrated interconnect. Moreover, the protective layer is or can be used as rear side metallization of a substrate containing a semiconductor substrate. By way of example, the substrate containing the semiconductor substrate is soldered onto a further substrate, e.g., a leadframe, e.g., by diffusion soldering. In the case of a rear side metallization, a buffer layer is used between the nickel-palladium layer and the substrate, the buffer layer being electrically conductive and containing e.g., silver, copper or nickel or a combination of the materials. As an alternative, the layer includes one of the materials. During the subsequent diffusion soldering, the nickel-palladium is e.g., simultaneously the solder that produces the connection to a further substrate, e.g., to a leadframe composed of copper. In this case, a high-temperature-resistant nickel-palladium-copper alloy, which optionally also contains gold if the nickel-palladium has been protected by a gold flash, is formed. Optionally, also in the case of rear side metallization, a nickel layer or nickel-phosphorus layer or a layer composed of some other suitable material, in particular a nickel alloy, e.g., NiV, NiMoP, can be used between the buffer layer and nickel-palladium layer, or such a layer is used.

In another embodiment, the protective layer can be contained, or is contained, as a second layer in a layer sequence containing an electrically conductive first layer (e.g., interconnect) or an inner region composed of a different material than the protective layer. The layer sequence can in turn be arranged both in the inner part of the integrated component and further outward. In one development, all the layers of the layer sequence can have the same geometrical course.

In a next embodiment, the integrated component can have or contains a substrate. The inner region (e.g., interconnect) can be applied or is applied on the substrate. The protective layer can be applied or is applied on the inner region (e.g., interconnect). The substrate contains e.g., a semiconductor substrate. The semiconductor substrate can be e.g., a monocrystalline substrate, in particular composed of silicon, or some other semiconductor, or else a compound semiconductor. The semiconductor substrate can also be an SOI (Silicon On Insulator) substrate. Further layers can be applied between the semiconductor substrate and the inner region, in particular using integrated technology (layer deposition, patterning with masks), e.g., sequences of via levels and interconnect levels. Further layers can also lie between the protective layer and the inner region.

A device with connection device on an integrated component or chip is provided. The integrated component includes at least one circuit element, in particular a semiconductor circuit element, at least one electrically conductive connection conductive structure and an electrically conductive connection between the semiconductor circuit element and the connection conductive structure. A connection area for an external connection of the integrated component is arranged on the connection conductive structure. The connection conductive structure contains the electrically conductive inner region and the electrically conductive protective layer, the material of which differs from the material nickel-palladium alloy.

With the connection device or the associated production method, a nickel-palladium layer can be used both on aluminum and on copper. Moreover, the use of nickel-palladium permits testing with needle cards without damage to contact metallization or dielectrics lying below the metallization, wire bonding with gold or aluminum wires or with other wires, and alternatively or even additionally, on the identically constructed layer sequences also the soldering of wires or metal sheets composed of gold, copper or other materials, in particular by using tin-silver or gold-tin solders or by using diffusion solders, hard intermetallic phases being formed such as e.g., $Cu_3Sn$ or $Au_5Sn$.

Moreover, the nickel-palladium layer can be applied both by electroplating in resist structures, so-called pattern plating, and by sputtering or other layer deposition processes. In the case of electroplating, a distinction is made between methods with external current and methods without external current. Methods with external current use an external voltage source during plating or electroplating. In particular, multi-chamber installations are used in this case. Given a suitable installation configuration, different metal layers can thus be deposited in situ sequentially in the same installation. In the case of nickel-palladium on thick copper tracks, e.g., in the case of power circuits, that is to say powers of greater than 0.5 watt, an improved geometry in the form of T-shaped overhangs of nickel-palladium on the copper tracks is present after the resist removal and a seed layer etch, with the result that the mechanical anchoring of molding compounds on the chip surface is increased and housing delamination is prevented.

For aluminum metallization, for example sputtering of nickel-palladium is effected in situ, that is to say in the same installation, with the aluminum. The patterning of nickel-palladium on aluminum is effected for example using the same resist mask as the aluminum etching, for example wet-chemically or dry-chemically, in particular by using a plasma composed of $SF_6$ (sulfur hexafluoride) and oxygen.

Further advantages include simple layer deposition of nickel-palladium by electroplating, that is to say that only a simple ECD (electrochemical deposition) chamber is required. For many products, the nickel-palladium layer can be applied in situ with the copper metallization, that is to say in the same installation. As an alternative, palladium can be applied by sputtering in the same installation with aluminum.

The nickel-palladium layer has a high hardness and is crack-free; in particular no embrittlement occurs as a result of heat treatment, which could be demonstrated experimentally.

The nickel-palladium layer affords good protection against damage to the contact metallization or against chip cracks during needle contact-making.

The nickel-palladium layer can be bonded well, in particular by wire bonding with, for example, aluminum, gold or copper.

The nickel-palladium layer can be soldered very well with wires or metal sheets.

If a chip carrier or leadframe is also coated with nickel-palladium, then identical surfaces of chip and leads (leadframe) can be obtained which enables electrical conductive connections of identical type. In particular the connections are equally good.

Electrolytes for the deposition of nickel-palladium are available, so that already successful experiments could be carried out.

On account of the lateral projections of the nickel-palladium layer with an underlying layer, for example an increased molding compound adhesion on the chip surface results, that is to say as a result of the T-profile of copper interconnects with nickel-palladium.

In one embodiment, the nickel-palladium layer contains e.g., more than 75% by weight or more than 95% by weight of nickel-palladium. In one embodiment, the proportion of palladium is greater than 50% by weight relative to all the atoms of the first layer. One useful range lies between 60% by weight and 80% by weight of palladium, in one embodiment 70% by weight.

If the protective layer adjoins the inner region and if the protective layer is arranged on the connection area, then e.g., only one electrically conductive layer has to be applied to the inner region, thus resulting in simple production.

If the connection conductive structure alternatively contains an electrically conductive third layer or auxiliary layer arranged between the connection area and the protective layer, then what can be achieved through the use of a layer stack is that the nickel-palladium layer is protected, for example. In one embodiment, gold is preferably used as material for the auxiliary layer. The auxiliary layer therefore lies further outward than the inner region and the protective layer. The layer thickness of the auxiliary layer lies e.g., within the range of 20 nanometers to 150 nanometers. The auxiliary layer protects the protective layer (nickel-palladium) against oxidation and/or hydrogen embrittlement. This can be advantageous particularly in the case of power devices.

In one embodiment, the inner region includes copper or a copper alloy containing at least 60 atomic percent of copper. The inner region thus has a small nonreactive resistance, such that power losses remain small. In particular the inner region has a thickness of greater than 1 micrometer, greater than 2 micrometers or even greater than 5 micrometers, but e.g., less than 30 micrometers. The component can thus be used for high-current applications or for power applications. By way of example, the component is used for switching currents within the range of 0.5 ampere to 10 amperes or even greater than 10 amperes, in particular in the automotive field. The switching power lies for example within the range of between 0.5 watt and 10 watts. In particular, the switching power is greater than 1 watt, for example.

If the protective layer projects laterally beyond the inner region, then it is possible for example to considerably increase the adhesion of an encapsulant or some other housing body of the component to the component. By way of example, a projection of at least 50 nanometers or at least 100 nanometers, but preferably less than 2 micrometers, arises.

The protective layer can be produced with a grain structure having an average grain size of greater than 100 nanometers or greater than 150 nanometers, particularly if an electrochemical method is used for deposition, in particular a method with external current. A phosphorus-free and therefore ductile layer can be produced as a result. This would not be the case for a method without external current (electroless).

As an alternative, the inner region can be produced from aluminum or from an aluminum alloy having at least 60 atomic percent of aluminum, such that advantages are afforded particularly in the case of logic circuits, that is to say in the case of circuits in which comparatively low powers are implemented.

The grain structure of an aluminum layer can preferably have an average grain size of less than 100 nanometers or less than 50 nanometers, as is the case for an aluminum layer produced with the aid of a sputtering method. However, the grains are for example larger than 5 nanometers. Since aluminum is usually applied by sputtering, the nickel-palladium layer is also applied by sputtering in order to be able to use an in-situ method, that is to say in the same installation.

A connection wire, one end of which is arranged on the connection area, can also be used. As an alternative or in addition, a soldering connection arranged on the connection area can be used. The connection area can also contain notches, as are typical of test needles. However, the notches are very small; in particular, they do not lead to cracks and do not impede e.g., subsequent bonding.

Furthermore, for example a connection device which is connected to the connection wire or to the soldering connection can be provided. The connection device is e.g., lead out from a housing surrounding the integrated component or from a filling material. The connection device is for example a chip carrier, e.g., part of a leadframe, a connection pin or a connection lamina.

Both the inner region and the protective layer can be produced by using an electrochemical deposition in particular with external current, such that the same installation can be used. This is advantageous particularly in the case of an inner region composed of copper. The use of only one installation makes it possible to lower the production costs.

If a resist mask, e.g., patterned photoresist, is used for the electrochemical deposition of the inner region, then the resist mask can also be used for the selective deposition of the nickel-palladium layer.

Both the inner region and the protective layer can be applied by sputtering, if appropriate onto still further layers. This can in turn be effected in the same installation or even in the same chamber.

Consequently, a hard coating material on chip contact metallization is used, namely nickel-palladium, which is hard, crack-free, solderable, wire-bondable and at the same time corrosion-resistant. Application can be effected by an electroplating process in situ by using copper electroplating, for example, or by sputtering, for example in situ with aluminum. The housing reliability for free-standing copper tracks with nickel-palladium hard coating is thus improved, in particular as a result of increased molding compound adhesion.

Cracking no longer occurs after thermal processes, as would be the case for example for nickel-phosphorus. Moreover, nickel-palladium is harder and stabler than, for example, a nickel-molybdenum-phosphorus alloy layer produced by an electroless galvanic deposition.

Insofar as "can" is mentioned in this application, this means both the possibility and the actual realization of the measure mentioned in an embodiment. Some embodiments of the invention are presented below with reference to Figures that serve merely for illustration and are not intended to restrict the scope of the invention.

Figure 1B:
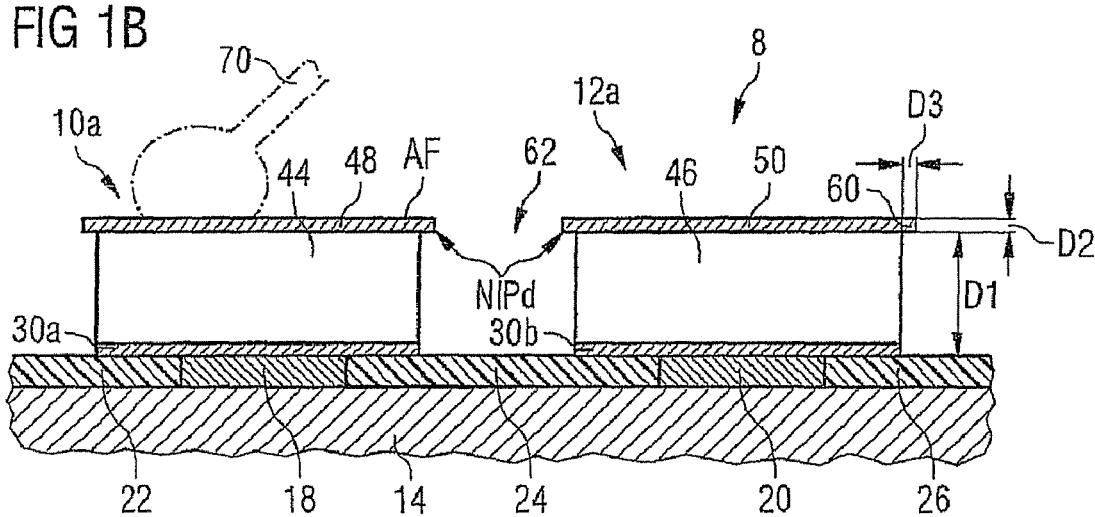

FIGS. 1A and 1B illustrate production stages in the production of an integrated component 8 with an integrated circuit and with an integrated connection device 10. The connection device 10 is illustrated in cross section and is formed on a substrate 14 containing a multiplicity of integrated semiconductor circuit elements, e.g., transistors, and also one or a plurality of metallization levels. By way of example, the substrate 14 contains a silicon lamina or chip or a lamina composed of some other semiconductor material. SOI substrates (Silicon On Insulator) are also used as an alternative.

A metallization level 16 is formed on the substrate 14, the metallization level containing a multiplicity of conductive structures, see conductive structures 18 and 20, for example, which are interconnects, for example. In the exemplary embodiment, the conductive structures 18 and 20 include copper or alternatively aluminum. Furthermore, an electrically insulating dielectric is arranged in the metallization level 16, see dielectric regions 22, 24 and 26, for example, the dielectric region 24 being arranged between the conductive structures 18 and 20.

An auxiliary layer 30 or an auxiliary layer stack was deposited over the whole area on the metallization level 16. In the exemplary embodiment, an auxiliary layer 30 composed of copper was deposited, which serves as current feeder in an electrochemical deposition method explained further below. In this case, a voltage is applied to the auxiliary layer 30 at the wafer edge.

A resist layer 32, for example composed of a light-sensitive material, such as photoresist, is subsequently applied. The resist layer 32 is selectively exposed with the aid of a mask. Development is subsequently effected, giving rise to resist regions 34, 36, 38 etc. A cutout 40 lying above the conductive structure 18 lies between the resist regions 34 and 36. A cutout 42 lying above the conductive structure 20 lies between the resist regions 36 and 38.

Afterward, copper is deposited with the aid of an electrogalvanic method, that is to say with external current, see copper connection pads 44, 46 or, in the case of a redistribution wiring, copper interconnects 44, 46. In the exemplary embodiment, the copper layer is thicker than 1 micrometer, typically thicker than 4 micrometers, but less than 30 micrometers. The copper interconnects 44 and 46 thus have a high current-carrying capacity such as are required in power circuits or in applications in the radiofrequency range, for example at frequencies of greater than 1 gigahertz.

After the copper has been deposited, a nickel-palladium layer is deposited in the same installation or else in a different installation, the layer being arranged selectively on the copper 44 and 46, see layer regions 48 and 50. The thickness of the nickel-palladium layer lies for example within the range of 1 micrometer to 3 micrometers, preferably within the range of 1.5 micrometers to 2.5 micrometers.

Subsequently, a protective layer 52, for example composed of gold, is optionally deposited as well. In this case, once again the same installation is used, that is to say that an electrochemical deposition takes place, e.g., preferably with or without external current. However, in the exemplary embodiment, the layer 52 is not used, so that only the nickel-palladium layer 48, 50 has to be deposited.

In another embodiment, a layer 56, 58 including nickel (in one embodiment applied with external current) or nickel-phosphorus (applied in electroless fashion) is applied prior to the application of the nickel-palladium layer 48, 50. As an alternative, other materials are used for the layers 56, 58, in particular nickel alloys, such as e.g., NiMoP or NiV. The layer 56, 58 has a layer thickness lying e.g., within the range of 1 micrometer to 3 micrometers. When NiP is used bonding over active areas is possible, that is to say over areas containing semiconductor components.

As is illustrated in FIG. 1B, the resist regions 34, 36, 38, etc. are subsequently removed. Afterward, the uncovered regions of the auxiliary layer 30 are removed with the aid of an etching process, in particular with the aid of a wet-chemical etching process. Lateral incipient etching of the conductive structures 44, 46 also occurs during the wet-chemical etching process. Since the etching process is also geared to copper, copper is incipiently etched to a greater extent than the nickel-palladium layer 48 and 50. Projections are formed at connection devices 10a and 12a that arise from the connection devices 10 and 12, see projection 60, for example, of the nickel-palladium layers 48, 50 that now project laterally beyond the conductive structures 44 and 46. The projection 60 has for example an overhang D3 of 100 to 2 micrometers, e.g., 1 micrometer. The thicknesses D1 of the copper interconnects 44, 66 and D2 of the nickel-palladium layers 48, 50 as illustrated in FIG. 1B have already been specified in greater detail in connection with FIG. 1A.

Consequently, after the removal of the resist layer, there are cutouts between the conductive structures 44, 46, see cutout 62, for example. The auxiliary layer 30 becomes auxiliary layer regions, see regions 30a and 30b between conductive structure 44 and conductive structure 18 and, respectively, conductive structure 46 and conductive structure 20.

The arrangement illustrated in FIG. 1B is subsequently connected to a chip carrier or to a leadframe with the aid of bonding wires, for example, see bonding wire 70, for example. However, it is also possible to use a flip-chip technique for the connection of the connection devices 10a and 12a.

In another exemplary embodiment, the same method processes as explained with reference to FIGS. 1A and 1B are carried out. The patterned resist layer and the seed layer are removed after the nickel-palladium layer 48, 50 has been applied. Afterward, the sidewalls of the conductive structures 44, 46 are covered with a sidewall layer, e.g., electrochemically in an electroless method e.g., with an NiP layer. As a result, the sidewalls of the conductive structures 44, 46 are also covered. Should the gold layer 52, 54 be applied, then it also covers the sidewalls in this exemplary embodiment.

In other exemplary embodiments, the conductive structures 44, 46 are likewise applied by electroplating. The nickel-palladium layer 48, 50 is applied by sputtering, however. In this case, the nickel-palladium layer can be patterned for example with the aid of a lift-off method if the resist is stripped off. However, the nickel-palladium layer can be patterned in some other way. In an alternative exemplary embodiment, no resist is applied, rather the conductive structures 44, 46 are applied by sputtering within a whole-area copper layer. The nickel-palladium layer 48, 50 is then applied by sputtering. The two layers are subsequently patterned, for example with the aid of a photolithographic method.

FIG. 2 illustrates an integrated component 108 with integrated connection devices 110, 112 that are formed on a substrate 213. The substrate 213 is constructed like the substrate 14, see explanations regarding FIG. 1A. In particular, a via level 200 is formed on the substrate 213, the via level containing vias 202, 204, and also electrically insulating insulation regions 206, 207 and 208. After the via level 200 has been patterned, an aluminum layer 210 is applied by sputtering over the whole area, e.g., in a thickness within the range of 1 micrometer to 5 micrometers. Afterward, in the same installation or in a different installation, a nickel-palladium layer 220 is applied by sputtering over the whole area, for example with a layer thickness within the range of 1 nanometer to 3 nanometers.

The two layers 210 and 220 are then patterned with the aid of a photolithographic method giving rise to interconnects 212 and 214 insulated from one another. The interconnect 212 is covered with a nickel-palladium layer region 222. The interconnect 214 is covered with a nickel-palladium region 224.

An insulating layer 230 is then deposited over the whole area, for example a silicon dioxide layer. An optional passivation layer 240 is applied to the insulating layer 230. The insulating layer 230 and the passivation layer 240 are then patterned with the aid of a photolithographic method, a cutout 250 being produced in the region of the interconnect 212. A cutout 252 is produced in the region of the interconnect 214. The cutout 250, 252 in each case reaches as far as the nickel-palladium layer region 222 and 224, respectively. The patterning process gives rise to insulating layer regions 232, 234 and 236 in the insulating layer 230, the insulating layer region 234 lying between the two cutouts 250 and 252, for example. In the passivation layer 240, the patterning gives rise to passivation layer regions 242, 244, 246 etc., as seen in cross section, the passivation layer region 244 lying between the cutouts 250 and 252 in the cross section illustrated in FIG. 2.

FIG. 3 illustrates an alternative device containing aluminum interconnects. However, a nickel-palladium layer is not applied by sputtering, but rather is applied with the aid of an electrochemical method. In this case, the procedure adopted is as explained above with reference to FIG. 2. In FIG. 3, reference symbols have the same meaning as in FIG. 2, but instead of the first digit "2" a first digit "3" is used in FIG. 3, see for example substrate 213 versus substrate 313, via level 200 versus via level 300, vias 202, 204 versus vias 302, 304, and insulation regions 206, 207 and 208 versus insulation regions 306, 307, and 308. However, the method in accordance with FIG. 3 involves firstly only applying aluminum by sputtering over the whole area, for example in a layer thickness within the range of 1 micrometer to 5 micrometers. The aluminum layer 310 is then patterned with the aid of a photolithographic method, giving rise to interconnects 312 and 314.

An insulating layer 330 is then applied, for example a silicon dioxide layer. An optional passivation layer 340, for example composed of a polyimide, is applied to the silicon dioxide layer 330 and in a manner adjoining the layer.

The insulating layer 330 and the passivation layer 340 are subsequently patterned with the aid of a photolithographic method and a resist mask (not illustrated), cutouts 350 and 352 being produced which reach as far as the interconnect 312 and 314, respectively. Insulating layer regions 332, 334 and 336 and passivation layer regions 342, 344 and 346 arise in this case.

After the removal of the resist mask, a thin auxiliary layer stack 360 is applied by sputtering over the whole area, e.g., containing e.g., a copper layer, the layer thickness of which lies e.g., within the range of 100 nanometers to 300 nanometers, with an underlying copper diffusion barrier, which has e.g., a layer thickness within the range of 20 to 300 nanometers and contains e.g., Ta/TaN. A resist layer 362 is then applied, exposed with the aid of a mask and developed, resist regions 364, 366 and 368 arising, and the cutouts 350, 352 again being uncovered as far as the auxiliary layer 360. Nickel-palladium is subsequently applied with the aid of a galvanic method. This gives rise to nickel-palladium layer regions 322 on the interconnect 312 and, respectively, 324 on the interconnect 314. The resist regions 364, 366 and 368 are then removed. The uncovered regions of the auxiliary layer 360 are removed in an etching-back step. The production of connection devices 410 and 412 is thus ended. By way of example, in a last step, bonding wires or solder balls are applied to the connection devices 410, 412 and also to further connection devices that are not illustrated.

It is also the case in the exemplary embodiment in accordance with FIG. 2 and FIG. 3 that, in one development, a gold flash is applied to the nickel-palladium layer. A barrier layer, for example, is also applied between the nickel-palladium layer and the aluminum layer, reference being made to the explanations regarding FIGS. 1A and 1B, that is to say in particular barriers composed of nickel-phosphorus or composed of other materials, in particular nickel alloys.

Figure 4:
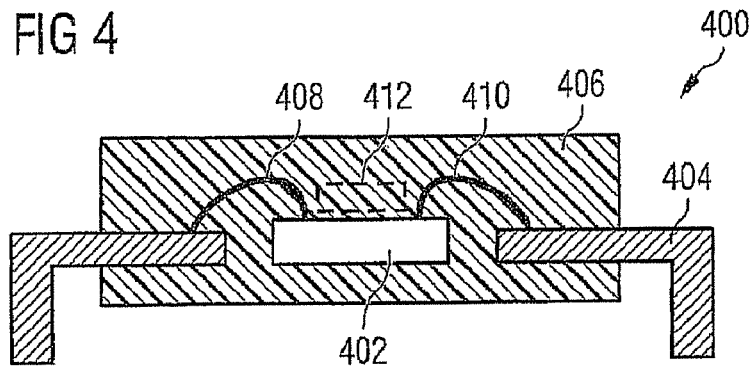
FIG. 4 illustrates an exemplary embodiment of an electronic device provided with a housing.

FIG. 4 illustrates an exemplary embodiment of an electronic device 400 provided with a housing. The device 400 contains a chip 402, e.g., the integrated component 8, 108 or 450, see FIG. 6. The device 400 additionally contains a multiplicity of connection pins, see e.g., connection pin 404. The connection pins 404 were stamped out e.g., from a leadframe.

The device 400 furthermore contains a housing body 406, e.g., composed of a molding compound, e.g., a polymer material. The chip 402 is connected to the connection pins e.g., by using bonding wires 408, 410. In addition, in an alternative embodiment, the device 400 can also contain a chip 412 arranged on the chip 402, e.g., using flip-chip technology. Consequently, not only bonding wires but also soldering connections are connected to the connection conductive structures explained.

Figure 5:
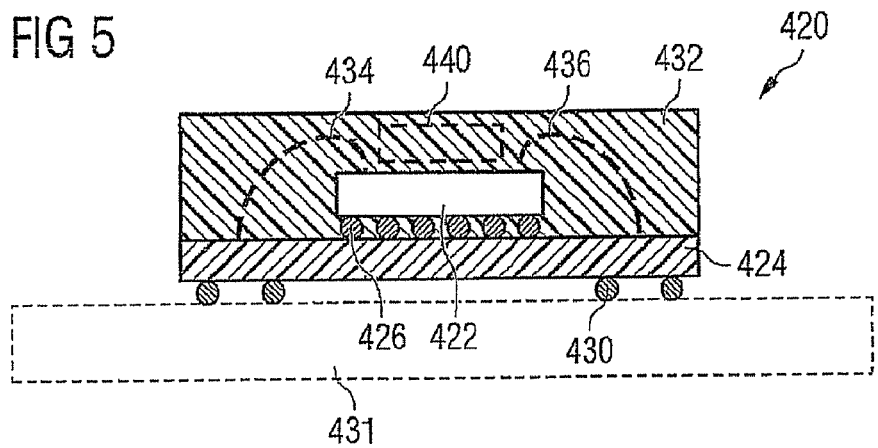
FIG. 5 illustrates a further exemplary embodiment of an electronic device provided with a housing.

FIG. 5 illustrates a further exemplary embodiment of an electronic device 420 provided with a housing. The device 420 contains a chip 422 constructed e.g., like the integrated components explained with reference to FIGS. 1A to 3. Furthermore, the device 420 contains a redistribution wiring 424, in particular a printed circuit board, e.g., composed of C4 material, a ceramic plate or a redistribution wiring 424 produced on a housing body 432 using thin-film technology. Connections 426 connect the chip 422 to the redistribution wiring. The connections 426 are solder balls, for example. In particular, the connections 426 are connected to the connection conductive structures explained above, which are protected by nickel-palladium.

Solder balls 430, for example, connect the device 420 to a printed circuit board 431 carrying e.g., further devices, in particular also passive parts such as coils and capacitors.

The device 420 contains a housing body 432, e.g., composed of the same material as the housing body 406. Optionally or alternatively to the connections 426 there are e.g., bonding wires 434, 436 between the chip 422 and the redistribution wiring 424. Optionally, there is also a further chip 440 in the device 420.

Figure 6:
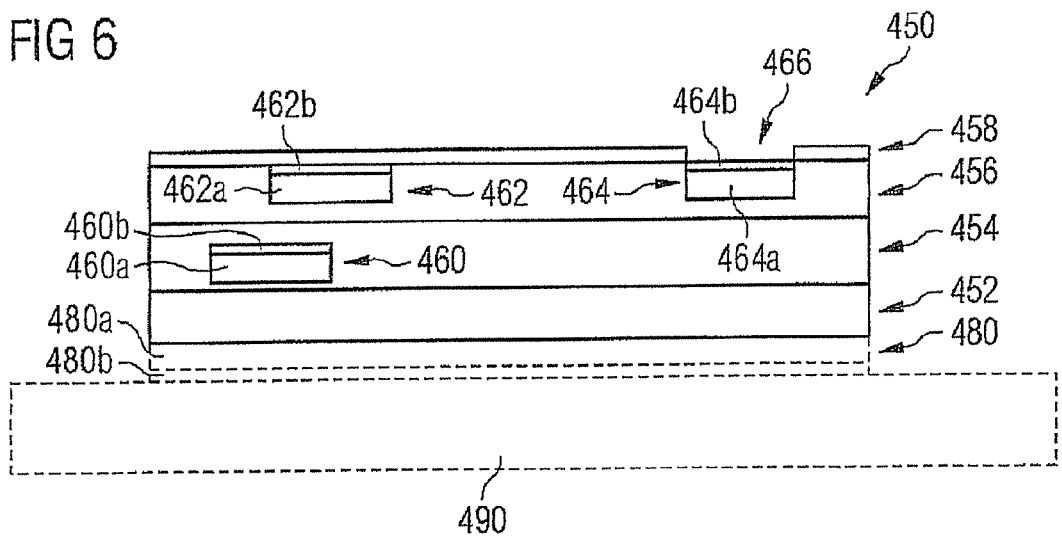
FIG. 6 illustrates a cross section through an integrated component.

FIG. 6 illustrates a cross section through an integrated component or chip 450. The chip 450 contains a semiconductor substrate 452, above that metallization levels 456, 454, e.g., using copper or aluminum technology, and passivation 458. Moreover, in the device 450 there is at least one of the layer sequences 460 to 464 corresponding to the layer sequences 44, optionally 56, 48 and optionally 52 and respectively 212, 222 and respectively 312, optionally 360, 324 explained with reference to FIGS. 1A to 3. The layer sequences 460 to 464 in each case contain a nickel-palladium alloy layer 460b, 462b and 464b, respectively, having the abovementioned layer thicknesses or having larger layer thicknesses. The layer sequence 460, 462 and 464 contains a first layer 460a, 462a and 464a, respectively, e.g., an aluminum layer or a copper layer. There are optionally further layers between the layers 460a, 462a and 464a and 460b, 462b and 464b, respectively, of a layer sequence 460, 463, 464, as explained above.

The layer sequence 460 is situated in the inner metallization level 454. The layer sequence 462 is situated in the outer metallization level 456, but is completely covered by the passivation 458 and is therefore not connected to an external connection, such as a bonding wire or the like. By contrast, the layer sequence 464 is situated under a connection opening 466 for e.g., a bonding wire or a soldering connection. In other exemplary embodiments, the component 450 also contains only one metallization level 456 or more than the two metallization levels illustrated, the layer sequences 460 to 464 likewise being arranged in all or only in selected metallization levels.

Instead of the layer sequence 460, 462 or 464 or in addition to at least one of the layer sequences 460, 462 or 464, in another exemplary embodiment the chip 450 contains a rear side metallization 480 on the rear side of a semiconductor substrate, the rear side being that side which is remote from the side with the control regions of semiconductor circuit elements. A first layer 480a of the layer sequence 480 is e.g., a copper layer. A second layer 480b of the layer sequence 480 is e.g., the nickel-palladium layer. There is optionally the abovementioned buffer layer between the layers 480a and 480b.

In an exemplary embodiment with rear side metallization 480 and with layer sequence 464 there is a soldering connection between a leadframe 490 or leadframe metal sheet or some other metal sheet, if appropriate with heat dissipating function and/or connection function, and the layer sequence 480. By contrast, a bonding wire is bonded (not illustrated) to the layer sequence 464. As an alternative, a wire is soldered onto the layer sequence 464. However, other mounting forms are also used, e.g., rear side clips remote from a carrier substrate, i.e. e.g., a printed circuit board or an interposer, and at the layer sequences 464 e.g., soldering connections (bumps, solder balls) directly to the carrier substrate.

In another exemplary embodiment, a metal sheet and a wire are soldered onto a connection, i.e. e.g., at the layer sequence 464 or 480. As an alternative, the wire can also be bonded on. By way of example, different connecting methods or the same connecting methods can also be employed at different connections of the chip front side.

The methods explained with reference to FIGS. 1A to 6 can advantageously be carried out at the wafer level. This means that the components or chips are separated from one another or singulated only after the method processes explained have been carried out.

Moreover, in each case only one deposition installation and only two metals or metal alloys can be used, namely e.g., aluminum and nickel-palladium or copper and nickel-palladium.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device comprising:
an integrated component comprising a semiconductor substrate including semiconductor circuit elements, and a layer containing a nickel-palladium alloy over the semiconductor substrate to provide the integrated circuit component with a resistance to cracking.

2. The device of claim 1, wherein the layer is contained as second layer in a layer sequence containing an electrically conductive first layer composed of a different material than the second layer.

3. The device of claim 2, wherein the first layer is applied on the substrate; and wherein the second layer is applied on the first layer.

4. The device of claim 2, wherein the first layer contains copper or comprises copper or contains a copper alloy or comprises a copper alloy, wherein the copper alloy contains at least 70 atomic percent of copper.

5. The device of claim 2, wherein the first layer contains aluminum or comprises aluminum or contains an aluminum alloy or comprises an aluminum alloy, wherein the aluminum alloy contains at least 70 atomic percent of aluminum.

6. The device of claim 2, wherein the device comprises:
a wiring device, having connection pins or a printed circuit board based on plastic or based on ceramic or a thin-film wiring arrangement;
or a further integrated component.

7. The device of claim 6, wherein the device comprises:
at least one connecting element that connects the second layer to the wiring device or to the further integrated component, wherein the connecting element comprises copper or a copper alloy or aluminum or an aluminum alloy or gold.

8. The device of claim 2, wherein the device comprises:
a metallic element soldered onto the second layer; and
wherein the metallic element comprises copper or a copper alloy.

9. The device of claim 2, wherein the device comprises:
a third layer, which is constructed like the first layer, and a fourth layer, which is constructed like the second layer; and
a metallic element soldered onto the fourth layer.

10. The device of claim 2, wherein the second layer projects laterally beyond the first layer.

11. The device of claim 1, wherein the device comprises:
a housing body, composed of an electrically insulating filling material; and
wherein the housing body covers the integrated component.

12. The device of claim 1, wherein the integrated component comprises:
at least one circuit element;
at least one electrically conductive connection conductive structure;
an electrically conductive connection between the circuit element and the connection conductive structure;
a connection area for an external connection of the integrated component is arranged on the connection conductive structure;
the connection conductive structure contains an electrically conductive first layer and an electrically conductive second layer, the material of which differs from the material of the first layer; and
the second layer contains nickel and palladium.

13. The device of claim 12, wherein the second layer is a nickel-palladium layer containing more than 75% by weight or more than 95% by weight of nickel-palladium.

14. The device of claim 12, wherein the second layer adjoins the first layer.

15. The device of one of claims 12, wherein the connection area is arranged on the second layer.

16. The device of claim 12, wherein the connection conductive structure contains an electrically conductive third layer arranged between the connection area and the second layer, and wherein the third layer contains a material that differs from the material of the second layer.

17. The device of claim 12, wherein the first layer comprises topper or a copper alloy having at least 60 atomic percent of copper.

18. The device of claim 17, wherein the first layer has a layer thickness of at least 2 micrometers.

19. The device of claim 17, wherein the second layer projects laterally beyond the first layer.

20. The device of claim 17, wherein the second layer has a grain structure having an average grain size of greater than 100 nanometers.

21. The device of claim 17, wherein the first layer consists of aluminum or an aluminum alloy having at least 60 atomic percent of aluminum.

22. The device of claim 21, wherein the second layer has a grain structure having an average grain size of less than 100 nanometers.

23. The device of claim 12, wherein a connection wire is present, one end of which is arranged on the connection area, or wherein a soldering connection is present which is arranged on the connection area.

24. The device of claim 23, wherein a connection unit is present which is connected to the connection wire or to the soldering connection, wherein the connection unit is led out from a housing body surrounding the integrated component.

25. The device of claim 12, wherein the integrated component comprises:
a layer which contains nickel or comprises nickel and which adjoins the layer containing the nickel-palladium alloy;
or wherein the integrated component comprises a layer which contains nickel-phosphorus or comprises nickel-phosphorus and which adjoins the layer containing the nickel-palladium alloy.

26. An integrated circuit comprising:
a semiconductor substrate;
at least one semiconductor circuit element formed in the semiconductor substrate;
a connection device formed over the substrate and electrically coupled to the at least one semiconductor circuit element, the connection device comprising a nickel-palladium alloy layer.

27. The integrated circuit of claim 26, wherein the connection device comprises an electrically conductive layer comprising a material different from the nickel-palladium alloy layer.

28. The integrated circuit of claim 27, wherein the electrically conductive layer is formed over the substrate and the nickel-palladium alloy layer is formed over the electrically conductive layer.

29. The integrated circuit of claim 28, wherein the electrically conductive layer comprises one of copper and aluminum.

30. The integrated circuit of claim 28, wherein the nickel-palladium alloy layer projects laterally beyond the electrically conductive layer.

31. The integrated circuit of claim 26, further comprising:
one of a solder ball and a bonding wire electrically coupled to the connection device.

* * * * *

UNITED STATES PATENT AND TRADEMARK OFFICE
CERTIFICATE OF CORRECTION

PATENT NO. : 7,755,190 B2
APPLICATION NO. : 11/835123
DATED : July 13, 2010
INVENTOR(S) : Schneegans et al.

Page 1 of 1

It is certified that error appears in the above-identified patent and that said Letters Patent is hereby corrected as shown below:

On the Title page, Item (75) Inventors, delete "Holger Torwesten, Neubiberg (DE)" and insert in place thereof --Holger Torwesten, Regensburg (DE)--.

Column 12, line 11, delete "topper" and insert in place thereof --copper--.

Signed and Sealed this

Thirtieth Day of November, 2010

David J. Kappos
*Director of the United States Patent and Trademark Office*